(12) United States Patent
Mori

(10) Patent No.: US 11,600,503 B2
(45) Date of Patent: Mar. 7, 2023

(54) HIGH-THROUGHPUT, MULTI-CHAMBER SUBSTRATE PROCESSING SYSTEM

(71) Applicant: ASM IP HOLDING B.V., Almere (NL)

(72) Inventor: Yukihiro Mori, Machida (JP)

(73) Assignee: ASM IP HOLDING B.V., Almere (NL)

( * ) Notice: Subject to any disclaimer, the term of this patent is extended or adjusted under 35 U.S.C. 154(b) by 120 days.

(21) Appl. No.: 17/317,794

(22) Filed: May 11, 2021

(65) Prior Publication Data
US 2021/0358780 A1  Nov. 18, 2021

Related U.S. Application Data

(60) Provisional application No. 62/704,482, filed on May 12, 2020.

(51) Int. Cl.
  *H01L 21/67* (2006.01)
(52) U.S. Cl.
  CPC .. *H01L 21/67161* (2013.01); *H01L 21/67184* (2013.01); *H01L 21/67196* (2013.01); *H01L 21/67201* (2013.01)
(58) Field of Classification Search
  CPC ......... H01L 21/67196; H01L 21/67201; H01L 21/67161; H01L 21/67184
  See application file for complete search history.

(56) References Cited

U.S. PATENT DOCUMENTS 9,147,592 B2  9/2015 Englhardt et al.
9,227,318 B1*  1/2016 Bai ................... H01L 21/67184
9,281,221 B2  3/2016 Kao et al.
9,312,155 B2  4/2016 Mori et al.
10,403,523 B2  9/2019 Kim et al.
2008/0171435 A1*  7/2008 Fujii ................. H01L 21/67745
  438/680

(Continued)

FOREIGN PATENT DOCUMENTS

JP  2019201083 A  * 11/2019  ........ H01L 21/67011
TW  202147503 A  * 12/2021  ....... H01L 21/67161

*Primary Examiner* — Kaitlin S Joerger
(74) *Attorney, Agent, or Firm* — Knobbe, Martens, Olson & Bear LLP

(57) ABSTRACT

A semiconductor processing system comprises a first, a second, and a third process module assembly. The third process module assembly is between the first and the second process module assemblies, and includes an opening for providing substrates to be processed in the various process module assemblies. The process modules are arranged laterally relative to the opening. The first and second process module assemblies each include an associated transfer chamber, an associated substrate transfer device, and a plurality of associated process modules attached the associated transfer chamber. The third process module assembly may include an associated transfer chamber, an associated substrate transfer device, and a single associated process module attached to the associated transfer chamber. The processing system is configured to sequentially load substrates into the process module assemblies neighboring the third process module assembly, and lastly load substrates into the process module of the third process module assembly.

22 Claims, 15 Drawing Sheets

(56) References Cited

U.S. PATENT DOCUMENTS

| | | | |
|---|---|---|---|
| 2013/0026135 A1* | 1/2013 | Kim | H01L 21/67196 |
| | | | 156/345.31 |
| 2014/0080304 A1* | 3/2014 | Zhang | H01L 21/67219 |
| | | | 257/E21.295 |
| 2014/0086720 A1* | 3/2014 | Kao | H01L 21/67161 |
| | | | 156/345.31 |
| 2014/0140792 A1* | 5/2014 | Kao | H01L 21/67184 |
| | | | 414/217 |
| 2014/0263165 A1* | 9/2014 | Hongkham | H01L 21/67184 |
| | | | 156/345.31 |
| 2017/0029948 A1 | 2/2017 | Jongbloed et al. | |
| 2017/0040204 A1* | 2/2017 | Kim | H01L 21/67184 |
| 2017/0263442 A1* | 9/2017 | Kang | C23C 16/45527 |
| 2017/0278074 A1 | 9/2017 | Komine et al. | |
| 2017/0358469 A1* | 12/2017 | Ishikawa | H01L 51/5084 |
| 2018/0040856 A1* | 2/2018 | Ishikawa | H01L 21/67173 |
| 2020/0381275 A1* | 12/2020 | Brezoczky | H01L 21/67161 |
| 2021/0358780 A1* | 11/2021 | Mori | H01L 21/67742 |
| 2022/0235453 A1* | 7/2022 | Savandaiah | C23C 14/3407 |

\* cited by examiner

| | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 |
|---|---|---|---|---|---|---|---|---|---|---|---|---|---|---|---|---|---|---|---|---|---|---|---|---|---|
| Port | 1~44 | | | | | | | | | | | | | | | | | | | | | | | | |
| Transfer Chamber | 1,2 | 3,4 | 5,6 | 7,8 | 9,10 | 11,12 | 13,14 | 15,16 | 17,18 | 19,20 | 21,22 | 23,24 | 25,26 | 27,28 | 29,30 | 31,32 | 33,34 | 35,36 | 37,38 | 39,40 | 41,42 | 43,44 | | | |
| Load lock Chamber | | 1,2 | 3,4 | 5,6 | 7,8 | 9,10 | 11,12 | 13,14 | 15,16 | 17,18 | 19,20 | 21,22 | 23,24 | 25,26 | 27,28 | 29,30 | 31,32 | 33,34 | 35,36 | 37,38 | 39,40 | 41,42 | 43,44 | | |
| Third Transfer Chamber | | | 1,2 | 3,4 | 5,6 | 7,8 | 9,10 | 11,12 | 13,14 | 15,16 | 17,18 | 19,20 | 21,22 | 23,24 | 25,26 | 27,28 | 29,30 | 31,32 | 33,34 | 35,36 | 37,38 | 39,40 | 41,42 | 43,44 | |
| First Buffer | | | | 1,2 | 3,4 | 5,6 | 7,8 | 9,10 | 11,12 | 13,14 | 15,16 | 17,18 | 19,20 | | | | | | | | | | | | |
| First Transfer Chamber | | | | | 1,2 | 3,4 | 5,6 | 7,8 | 9,10 | 11,12 | 13,14 | 15,16 | 17,18 | 19,20 | | | | | | | | | | | |
| Second Buffer | | | | | | | | | | | | | | | 21,22 | 23,24 | 25,26 | 27,28 | 29,30 | 31,32 | 33,34 | 35,36 | 37,38 | 39,40 | |
| Second Transfer Chamber | | | | | | | | | | | | | | | | 21,22 | 23,24 | 25,26 | 27,28 | 29,30 | 31,32 | 33,34 | 35,36 | 37,38 | 39,40 |
| Module 1-1 | | | | | | 1,2 | 1~4 | | | | | | | | | | | | | | | | | | |
| Module 1-2 | | | | | | | | 5,6 | 5~8 | | | | | | | | | | | | | | | | |
| Module 1-3 | | | | | | | | | | 9,10 | 9~12 | | | | | | | | | | | | | | |
| Module 1-4 | | | | | | | | | | | | | 13,14 | 13~16 | | | | | | | | | | | |
| Module 1-5 | | | | | | | | | | | | | | | 17,18 | 17~20 | | | | | | | | | |
| Module 2-1 | | | | | | | | | | | | | | | | | 21,22 | 21~24 | | | | | | | |
| Module 2-2 | | | | | | | | | | | | | | | | | | | 25,26 | 25~28 | | | | | |
| Module 2-3 | | | | | | | | | | | | | | | | | | | | | 29,30 | 29~32 | | | |
| Module 2-4 | | | | | | | | | | | | | | | | | | | | | | | 33,34 | 34~36 | |
| Module 2-5 | | | | | | | | | | | | | | | | | | | | | | | | 37,38 | 37~40 |
| Module 3-1 | | | | | | | | | | | | | | | | | | | | | | | | | 41,42 41~44 |

| | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| Port | 1,2 | | | | | | | | | | | | | | | | | | | |
| Transfer Chamber | | 3,4 | 5,6 | 7,8 | 9,10 | 11,12 | 13,14 | 15,16 | 17,18 | 19,20 | 21,22 | 23,24 | 25,26 | 27,28 | 29,30 | 31,32 | 33,34 | 35,36 | 37,38 | 39,40 |
| Load lock Chamber | | | 1,2 | | 3,4 | 5,6 | 7,8 | 9,10 | 11,12 | 13,14 | 15,16 | 17,18 | 19,20 | 21,22 | 23,24 | 25,26 | 27,28 | 29,30 | 31,32 | 33,34 | 35,36 | 37,38 |
| Third Transfer Chamber | | | | 1,2 | | 3,4 | 5,6 | 7,8 | 9,10 | 11,12 | 13,14 | 15,16 | 17,18 | 19,20 | 21,22 | 23,24 | 25,26 | 27,28 | 29,30 | 31,32 | 33,34 | 35,36 |
| First Buffer | | | | | 1,2 | | | | | 11,12 | 13,14 | 15,16 | 17,18 | 19,20 | | | | | | | |
| First Transfer Chamber | | | | | | 1,2 | 3,4 | 5,6 | 7,8 | 9,10 | 11,12 | 13,14 | 15,16 | 17,18 | 19,20 | | | | | | |
| Second Buffer | | | | | | | 1,2 | | | | | | | | | 21,22 | 23,24 | 25,26 | 27,28 | 29,30 | 31,32 | 33,34 |
| Second Transfer Chamber | | | | | | | | 1,2 | | | | | | | | | 21,22 | 23,24 | 25,26 | 27,28 | 29,30 | 31,32 |
| Module 1-1' | | | | | | | 1~4 | | | | | | | | | | | | | |
| Module 1-2' | | | | | | | | 5,6 | 5~8 | | | | | | | | | | | |
| Module 1-3' | | | | | | | | | | 9,10 | 9~12 | | | | | | | | | |
| Module 1-4' | | | | | | | | | | | | | 13,14 | 13~16 | | | | | | |
| Module 1-5' | | | | | | | | | | | | | | | 17,18 | 17~20 | | | | |
| Module 2-1' | | | | | | | | | | | | | | | | | 21,22 | 21~24 | | |
| Module 2-2' | | | | | | | | | | | | | | | | | | | 25,26 | 25~28 |
| Module 2-3' | | | | | | | | | | | | | | | | | | | | | 29,30 |
| Module 2-4' | | | | | | | | | | | | | | | | | | | | |
| Module 2-5' | | | | | | | | | | | | | | | | | | | | |
| Module 3-1' | | | | | | | | | | | | | | | | | | | | |

Process Sequence

| FIG. 9(a) | FIG. 9(b) | FIG. 9(c) |

| | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| Port | 1~44 | | | | | | | | | | | | | | |
| Transfer Chamber | 1,2 | 3,4 | 5,6 | 7,8 | 9,10 | 11,12 | 13,14 | 15,16 | 17,18 | 19,20 | 41,44 | | | | |
| | 21,22 | 23,24 | 25,26 | 27,28 | 29,30 | 31,32 | 33,34 | 35,36 | 37,38 | 39,40 | | | | | |
| Load lock Chamber | | 1,2 | 3,4 | 5,6 | 7,8 | 9,10 | 11,12 | 13,14 | 15,16 | 17,18 | 19,20 | 41,44 | | | |
| | | 21,22 | 23,24 | 25,26 | 27,28 | 29,30 | 31,32 | 33,34 | 35,36 | 37,38 | 39,40 | | | | |
| Third Transfer Chamber | | | 1,2 | 3,4 | 5,6 | 7,8 | 9,10 | 11,12 | 13,14 | 15,16 | 17,18 | 19,20 | 41,44 | | |
| | | | 21,22 | 23,24 | 25,26 | 27,28 | 29,30 | 31,32 | 33,34 | 35,36 | 37,38 | 39,40 | | | |
| First Buffer | | | | 1,2 | 3,4 | 5,6 | 7,8 | 9,10 | 11,12 | 13,14 | 15,16 | 17,18 | 19,20 | | |
| First Transfer Chamber | | | | | 1,2 | 3,4 | 5,6 | 7,8 | 9,10 | 11,12 | 13,14 | 15,16 | 17,18,19,20 | | |
| Second Buffer | | | | 21,22 | 23,24 | 25,26 | 27,28 | 29,30 | 31,32 | 33,34 | 35,36 | 37,38 | 39,40 | | |
| Second Transfer Chamber | | | | | 21,22 | 23,24 | 25,26 | 27,28 | 29,30 | 31,32 | 33,34 | 35,36 | 37,38 | 39,40 | |
| Module 1-1 | | | | | | 1,2 | 1~4 | | | | | | | | |
| Module 1-2 | | | | | | | | 5,6 | 5~8 | | | | | | |
| Module 1-3 | | | | | | | | | | 9,10 | 9~12 | | | | |
| Module 1-4 | | | | | | | | | | | | 13,14 | 13~16 | | |
| Module 1-5 | | | | | | | | | | | | | | 17,18 | 17~20 |
| Module 2-1 | | | | | | 21,22 | 21~24 | | | | | | | | |
| Module 2-2 | | | | | | | | 25,26 | 25~28 | | | | | | |
| Module 2-3 | | | | | | | | | | 29,30 | 29~32 | | | | |
| Module 2-4 | | | | | | | | | | | | 33,34 | 33~36 | | |
| Module 2-5 | | | | | | | | | | | | | | 37,38 | 37~40 |
| Module 3-1 | | | | | | | | | | | | | | 41~44 | |

FIG. 11

| | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| Port | | | | | | | | | | | | | | | | 1~44 |
| Transfer Chamber | | | | | 1,2 21,22 | 3,4 23,24 | 5,6 25,26 | 7,8 27,28 | 9,10 29,30 | 11,12 31,32 | 13,14 33,34 | 15,16 35,36 | 17,18 37,38 | 19,20 39,40 | 41,44 | |
| Load lock Chamber | | | | 1,2 21,22 | 3,4 23,24 | 5,6 25,26 | 7,8 27,28 | 9,10 29,30 | 11,12 31,32 | 13,14 33,34 | 15,16 35,36 | 17,18 37,38 | 19,20 39,40 | 41,44 | | |
| Third Transfer Chamber | | | 1,2 21,22 | 3,4 23,24 | 5,6 25,26 | 7,8 27,28 | 9,10 29,30 | 11,12 31,32 | 13,14 33,34 | 15,16 35,36 | 17,18 37,38 | 19,20 39,40 | 41,44 | | | |
| First Buffer | | 1,2 | 3,4 | 5,6 | 7,8 | 9,10 | 11,12 | 13,14 | 15,16 | 17,18 | 19,20 | | | | | |
| First Transfer Chamber | 1,2 | 3,4 | 5,6 | 7,8 | 9,10 | 11,12 | 13,14 | 15,16 | 17,18 | 19,20 | | | | | | |
| Second Buffer | 21,22 | 23,24 | 25,26 | 27,28 | 29,30 | 31,32 | 33,34 | 35,36 | 37,38 | 39,40 | | | | | | |
| Second Transfer Chamber | 21,22 | 23,24 | 25,26 | 27,28 | 29,30 | 31,32 | 33,34 | 35,36 | 37,38 | 39,40 | | | | | | |
| Module 1-1 | 1,2 | 1~4 | | | | | | | | | | | | | | |
| Module 1-2 | | 5,6 | 5~8 | | | | | | | | | | | | | |
| Module 1-3 | | | | 9-10 | 9-12 | | | | | | | | | | | |
| Module 1-4 | | | | | | 13,14 | 13-16 | | | | | | | | | |
| Module 1-5 | | | | | | | | 17,18 | 17~20 | | | | | | | |
| Module 2-1 | 21,22 23,24 | | | | | | | | | | | | | | | |
| Module 2-2 | | 25,26 27,28 | | | | | | | | | | | | | | |
| Module 2-3 | | | | 29,30 31,32 | | | | | | | | | | | | |
| Module 2-4 | | | | | | 33,34 35,36 | | | | | | | | | | |
| Module 2-5 | | | | | | | | 37,38 39,40 | | | | | | | | |
| Module 3-1 | | | | | | | 41-44 | | | | | | | | | |

HIGH-THROUGHPUT, MULTI-CHAMBER SUBSTRATE PROCESSING SYSTEM

CROSS REFERENCE TO PRIORITY APPLICATIONS

Any and all applications for which a foreign or domestic priority claim is identified in the Application Data Sheet as filed with the present application are hereby incorporated by reference under 37 CFR 1.57. This application claims the benefit of priority to U.S. Provisional Patent Application No. 62/704,482, filed May 12, 2020 and entitled "HIGH-THROUGHPUT, MULTI-CHAMBER SUBSTRATE PROCESSING SYSTEM," which is hereby incorporated by reference in its entirety herein.

BACKGROUND

Field

The present application relates to substrate processing systems and, more particularly, to substrate processing systems having multiple process chambers.

Background

Manufacturing semiconductor devices, such as in integrated circuit fabrication, typically involves subjecting a substrate (such as a semiconductor wafer) to many processes, such as polishing, deposition, etching, photolithography, heat treatment, etc. Due to stringent demands on the quality of process results, in some cases, these different processes may be conducted in dedicated chambers that are configured to process a single substrate at a time. As a result, processing multiple substrates at a time requires that processing systems have multiple process chambers.

The bulkiness of systems having these multiple chambers, and the need to move substrates within the system, may cause constraints on process throughput. Accordingly, there is a continuing need for systems and methods for processing substrates in multiple chambers with high throughput.

SUMMARY

In some embodiments, a semiconductor processing system for processing substrates comprises a first process module assembly, a second process module assembly, a third process module assembly, and a controller. The first process module comprises a first transfer chamber comprising a first substrate transfer device, and a plurality of first process modules. The first process modules is attached to the first transfer chamber and accessible by the first substrate transfer device. The second process module assembly comprises a second transfer chamber comprising a second substrate transfer device, and a plurality of second process modules. The second process modules is attached to the second transfer chamber and accessible by the second substrate transfer device. The third process module assembly is disposed between the first process module assembly and the second process module assembly. The third process module assembly comprises a third transfer chamber comprising a third substrate transfer device, a third process module attached to the third transfer chamber and accessible by the third substrate transfer device, and a resealable opening for receiving substrates from an external environment. A first side of the third process module assembly is attached to the first process module assembly and a second side of the third process module assembly is attached to the second process module assembly. The controller is configured to perform actions comprising: sequentially loading substrates from the load lock chamber to the first process modules, the second process modules and the third process module using the first, the second, and the third substrate transfer devices; processing substrates loaded into the process modules; and unloading, using the first, the second, and the third substrate transfer devices, processed substrates from the first and second process modules before unloading processed substrates from the third process module.

In some embodiments, the processing substrates comprises sequentially starting processing of substrates in the process modules upon completion of loading of each process module, while other process modules are being loaded.

In some embodiments, unloading processed substrates comprises sequentially unloading substrates from the first process modules, the second process modules, and then the third process module.

In some embodiments, the first process module assembly and the second process module assembly are attached to opposite sides of the third process module assembly.

In some embodiments, the processing system further comprises a load lock chamber configured to interface with the resealable opening, and a transport chamber comprising a plurality of load ports for interfacing with substrate carriers. The transport chamber is attached to and configured to provide substrates to the load lock chamber.

In some embodiments, the third process module is attached to a side of the third transfer chamber opposite the resealable opening.

In some embodiments, sequentially loading substrates comprises directly transferring substrates from the third substrate transfer device to the first substrate transfer device, and directly transferring substrates from the third substrate transfer device to the second substrate transfer device In some embodiments, the first substrate transfer device comprises first arms, each having a first end effector, the second substrate transfer device comprises second arms, each having a second end effector, and the third substrate transfer device comprises third arms, each having a third end effector. Each of the first, second and the third end effectors comprising two pick-up extensions that are spaced apart from each other, wherein a distance between the two pick-up extensions of the third end effector is different from that between the two pick-up extensions of the first and the second end effectors.

In some embodiments, each of the first transfer chamber and the second transfer chamber has a shape of a hexagon as viewed from above and comprises five sides for interfacing with five first process modules and five second process modules, respectively.

In some embodiments, the load lock chamber comprises a plurality of load lock stations for accommodating a plurality of substrates.

In some embodiments, the processing system further comprises a first buffer chamber disposed between the first process module assembly and the third process module assembly and a second buffer chamber disposed between the second process module assembly and the third process module assembly.

In some embodiments, the first buffer chamber and the second buffer chamber comprise two stations each configured to accommodate a substrate, respectively.

In some embodiments, the first buffer chamber and the second buffer chamber comprise four stations each configured to accommodate a substrate, respectively.

In some embodiments, a semiconductor processing system for processing substrates comprises a first process module assembly, a second process module assembly, a third process module assembly, an a controller. The first process module assembly comprises a first transfer chamber comprising a first substrate transfer device and a plurality of first process modules. The first process modules is attached to the first transfer chamber and accessible by the first substrate transfer device. The second process module assembly comprises a second transfer chamber comprising a second substrate transfer device, and a plurality of second process modules. The second process modules is attached to the second transfer chamber and accessible by the second substrate transfer device. The third process module assembly is disposed between the first process module assembly and the second process module assembly. The third process module assembly comprises a third transfer chamber comprising a third substrate transfer device, a third process module attached to the third transfer chamber and accessible by the third substrate transfer device, and a resealable opening for receiving substrates from an external environment. A first side of the third process module assembly is attached to the first process module assembly and a second side of the third process module assembly is attached to the second process module assembly. The controller is configured to perform actions comprising: loading substrates into the first process modules and the third process modules at overlapping times; subsequently loading substrates into the third process module; processing substrates loaded into the process modules; unloading processed substrates from the first process modules and the second process modules at overlapping times; and subsequently unloading processed substrates from the third process module.

In some embodiments, the processing system further comprises a load lock chamber configured to interface with the resealable opening and a transport chamber comprising a plurality of load ports for interfacing with substrate carriers. The transport chamber is attached to and configured to provide substrates to the load lock chamber.

In some embodiments, each of the first process module, the second process module, and the third process module comprises four reaction chambers for processing substrates.

In some embodiments, each of the first transfer chamber assembly and the second transfer chamber has a shape of a hexagon as viewed from above and comprises five sites for interfacing with five first process modules and five second process modules, respectively.

In some embodiments, each of the first substrate transfer device, the second substrate transfer device, and the third substrate transfer device comprises four arms, respectively.

In some embodiments, the processing system further comprises comprising a first buffer chamber disposed between the first process module assembly and the third process module assembly and a second buffer chamber disposed between the second process module assembly and the third process module assembly.

In some embodiments, wherein the first buffer chamber and the second buffer chamber comprise two stations each configured to accommodate a substrate.

In some embodiments, the first buffer chamber and the second buffer chamber comprise four stations each configured to accommodate a substrate.

BRIEF DESCRIPTION OF THE DRAWINGS

FIG. 5 is a table describing the substrate-loading steps in the substrate loading sequence of FIG. 4.

FIG. 7 is a table describing the substrate-unloading steps in the substrate loading sequence of FIG. 6.

FIGS. 9(a)-9(c) form a diagram schematically illustrating an overall sequence using the substrate processing system of FIGS. 4 and 6.

FIG. 10 is another example of a table showing substrate-loading steps for the substrate processing system of FIG. 4.

FIG. 11 is another example of a table showing substrate-unloading steps for the substrate processing system of FIG. 4.

DETAILED DESCRIPTION

Figure 1A:
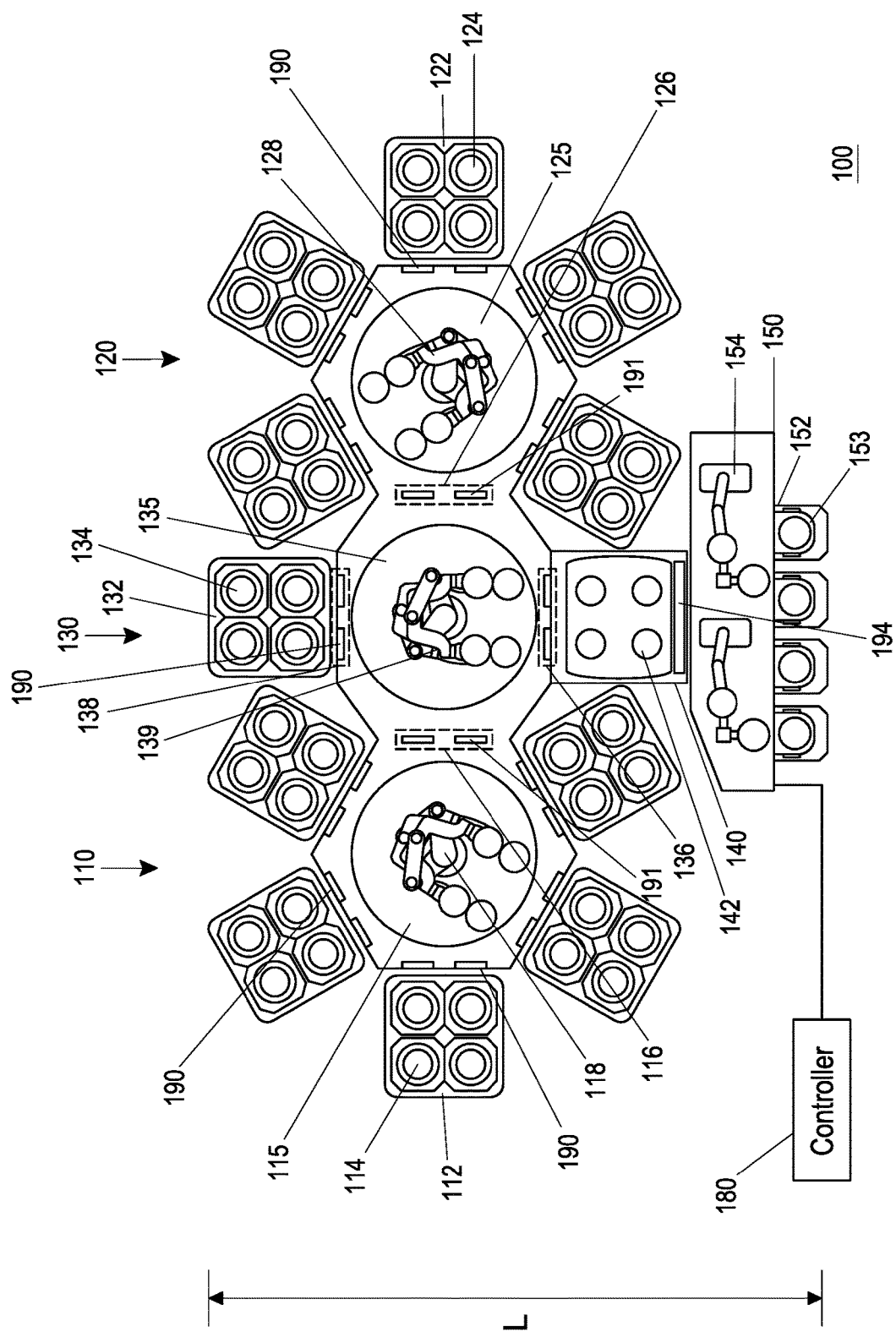
FIG. 1A is a schematic plan view of a substrate processing system equipped with a plurality of horizontally-oriented process module assemblies.

In some embodiments, a semiconductor processing system includes horizontally-oriented process module assemblies. Each process module assembly includes a central transfer chamber with one or more process modules arrayed around the transfer chamber. The process module assemblies may each include reaction chambers for processing semiconductor substrates (e.g., semiconductor wafers). The semiconductor processing system may include at least three process module assemblies that allow substrate communication between them, with a central one of the process module assemblies having a resealable door (e.g., a gate valve) through which substrates may be provided for processing in any of the process module assemblies. In some embodiments, the door may provide an opening to a load lock chamber, which may in turn have a door that opens to a transport chamber for receiving substrate carriers.

The process module assemblies are horizontally-oriented in the sense that, as a unit, the process module assemblies are arranged so that they extend laterally across the door of the central one of the process module assemblies. In some embodiments, in a clean room, the horizontally-oriented process module assemblies may extend laterally across a wall of the clean room. This is in contrast to a processing system having vertically-oriented process module assemblies in which the process module assemblies extend in a line from an opening of the processing system towards a wall of the clean room.

As described further herein, the central process module simply allows for efficient loading and unloading sequences in which substrates may be first loaded into neighboring process module assemblies. For example, the substrates may be loaded sequentially into different ones of the process module assemblies, or may be simultaneously loaded into the neighboring process module assemblies, in a coordinated sequence.

Advantageously, the horizontally-oriented semiconductor processing system disclosed herein may provide one or more advantages. For example, by extending laterally, the semiconductor processing system allows the addition of greater numbers of process module assemblies than vertically-oriented processing systems, which may be constrained from adding additional process module assemblies by the available distance to the back wall of the clean room. This distance may undesirably be smaller than the distance in the lateral dimension. In addition, as discussed herein, even when a similar number of process module assemblies are provided in a vertically-oriented processing system, the total number of process modules for the horizontally-oriented processing system may be greater, which can increase process throughput. In addition, as discussed herein, loading and processing efficiency may be increased since the distance and/or number of substrate handling robots needed to move a particular substrate from a substrate carrier to a process module may be decreased, relative to a vertically-oriented processing system in which substrates may need to flow through all of the process module assemblies to reach some process modules.

Reference will now be made to the figures, in which like numerals refer to like parts throughout.

FIG. 1A is a schematic plan view of a substrate processing system 100 equipped with a plurality of horizontally-oriented process module assemblies 110, 120, 130. Each of the process module assemblies 110, 120, 130 include one or more process modules 112, 122, 132, arrayed around a central transfer chamber 115, 125, 135, respectively. The process modules 112, 122, 132 may each include a plurality of reaction chambers 114, 124, 134, respectively, for processing substrates, with one substrate accommodated in a dedicated chamber during processing. In the illustrated embodiment, three horizontally-oriented process module assemblies are shown. In some other embodiments, the substrate processing system 100 may include greater numbers of process module assemblies, for example, four, five, etc. process module assemblies.

The processing system 100 may further include a controller 180 which may include hardware microprocessors, microcontrollers, programmable logic controllers, dedicated hardware, and/or memory or the like. It will be appreciated that the various pieces of hardware forming the controller 180 may be resident in a common location, or may be distributed pieces of hardware that are in communication with one another. The controller may be programmed or otherwise configured to cause the various processes described herein to be conducted. The processes may include, for example, any of the loading, processing, and/or unloading sequences described herein. In some embodiments, the processes may be programmed into the controller by being stored as instructions in a non-transitory computer-readable medium (e.g., a memory). The controller may be in communication with and configured to send instructions to the various power sources, heating systems, pumps, robotics (e.g., substrate transport arms), and gas flow controllers or valves of the processing system 100 to effectuate the processes in the programming, as will be appreciated by the skilled artisan.

With continued reference to FIG. 1A, the substrate processing system 100 may include a first process module assembly 110, a second process module assembly 120, and a third process module assembly 130. The substrate processing system 100 may further include a load lock chamber 140 and a transport chamber 150.

The first process module assembly 110 may include a plurality of first process modules 112 and a first transfer chamber 115. Each of the first process modules 112 may include a plurality of first reaction chambers 114. The first transfer chamber 115 includes a substrate transfer device 118, which may be a transfer arm and may also be referred to as a first transfer arm. The first substrate transfer device 118 is configured to receive a substrate and to transfer the substrate to one of the first process modules 112 or to the third transfer chamber 135. Module doors 190, schematically illustrated as pairs of rectangular partitions, are disposed between each first process module 112 and the first transfer chamber 115. It will be appreciated that the module doors 190 may be resealable closures such as gate valves and the number of the module door(s) 190 in FIG. 1A is for illustration purposes only and may be varied as desired for substrate access and sealing between volumes. The module door(s) 190 for a particular first process module 112 may be opened when the first substrate transfer device 118 transfers a substrate into or from that first process modules 112. The corresponding module door(s) 190 may be closed after the substrate is transferred into or removed from the first process module 112. It will be appreciated that the operation of the module door(s) 190, transfer arms, etc. may be controlled by the controller 180.

In some embodiments, the first process module assembly 110 may have a hexagonal shape as viewed from above (such as in the illustrated top-down plan view) and may have a plurality of first process modules 112, e.g., five first process modules 112. The first process module 112 may be attached to a side of the first transfer chamber 115. In some embodiments, each first process module 112 includes a plurality of first reaction chambers 114, e.g., four first reaction chambers 114. As illustrated, the four first reaction chambers 114 may be arranged in 2×2 matrix, but it will be appreciated that other arrangements are possible. Each of the first reaction chambers 114 may be used to process a substrate. Preferably, each of the first reaction chambers 114 is a single-substrate chamber configured to process a single substrate at a time. For example, the first reaction chambers 114 may be sized and have a substrate support configured to accommodate only a single substrate. In some embodiments, the first reaction chamber 114 may be a plasma enhanced chemical vapor deposition (CVD) reaction chamber, a thermal CVD reaction chamber, a plasma enhanced atomic layer deposition (ALD) reaction chamber, a thermal ALD reaction chamber, an etching reaction chamber, a UV-curing reaction chamber, etc. The first reaction chamber 114 may include a commercially available reaction chamber such as the F-120® reaction chamber, F-450® reaction chamber, Pulsar® reaction chamber (such as the Pulsar® 2000 and the Pulsar® 3000), EmerALD® reaction chamber, and/or Advance® 400 Series reaction chambers, available from ASM America, Inc. of Phoenix, Ariz. and ASM Europe B.V., Almere, Netherlands. Other commercially available reaction chambers include those from ASM Japan K.K (of Tokyo, Japan) sold under the tradenames Eagle® XP and XP8.

In some embodiments, the first substrate transfer device 118 may be a transfer arm that includes two or more transfer sub-arms. In some embodiments, a main driving portion of each of the two or more transfer sub-arms may have various articulating structures, e.g., a 3-link selective compliant articulated robot arm (SCARA), a 4-link SCARA, a bisymmetric arm, a frog-leg/scissors type arm, and a linear sliding arm. Each of the two or more transfer sub-arms may include one or more end effectors. For example, each of the two or more transfer sub-arms may include a plurality of end effectors, e.g., two end effectors. The number of end effectors may be equal to the number of stations arranged as a matrix in the load-lock chamber 140 or the number of the first reaction chambers 114 in one first process modules 112 shown in FIG. 1A.

Each first process module 112 may be connected to the first transfer chamber 115 via a module door 190. The module door 190 may be configured to may be opened and closed to provide access to and to isolate, respectively, the first reaction chamber 114 from the first transfer chamber 115. For example, the first reaction chamber 114 may be isolated from the first transfer chamber 115 after transferring a substrate into the first reaction chamber 114 and while the substrate is processed. Thus, a highly controlled process environment in the first reaction chamber 114 may be maintained and cross contamination may be prevented.

With continued reference to FIG. 1A, the second process module assembly 120 may include a plurality of second process modules 122 and a second transfer chamber 125. Each of the second process modules 122 may include a plurality of second reaction chambers 124. The second transfer chamber 125 includes a substrate transfer device, which may be a transfer arm and may also be referred to as a second transfer arm. The second substrate transfer device 128 is configured to receive a substrate and transfer the substrate to one of the second process modules 122 or to the third transfer chamber 135. One or more module doors 190 may be disposed between each second process module 122 and the second transfer chamber 125. As noted herein, the number of the module doors 190 in FIG. 1A is for illustration purposes only and may be varied as desired for substrate access and sealing between volumes. The module door(s) 190 may be opened when the second substrate transfer device 128 transfers a substrate into or out from the second process modules 122 (during loading and unloading, respectively). The module door(s) 190 may be closed after the substrate is transferred into or removed from the second process modules 122. The operation of the module door(s) 190, transfer arms, etc. may be controlled by the controller 180.

In some embodiments, the second process module assembly 120 may have a hexagonal shape as viewed from above (such as in the illustrated top-down plan view) and may have a plurality of second process modules 122, e.g., five second process modules 122. The second process module 122 may be attached to a side of the second transfer chamber 125. In some embodiments, each second process module 122 includes a plurality of second reaction chambers 124, e.g., four second reaction chambers 124. As illustrated, the four second reaction chambers 124 may be arranged in 2×2 matrix, but other arrangements are possible. Each of the second reaction chambers 124 may be used to process a substrate. Preferably, each of the second reaction chambers 124 is a single-substrate chamber configured to process a single substrate at a time. It will be appreciated that the second reaction chambers 124 may be similar to the first reaction chambers 114. For example, in some embodiments, the first reaction chamber 114 may be a plasma enhanced chemical vapor deposition (CVD) reaction chamber, a thermal CVD reaction chamber, a plasma enhanced atomic layer deposition (ALD) reaction chamber, a thermal ALD reaction chamber, an etching reaction chamber, a UV-curing reaction chamber, etc. The first reaction chamber 114 may include a commercially available reaction chamber such as the F-120° reaction chamber, F-450® reaction chamber, Pulsar® reaction chamber (such as the Pulsar® 2000 and the Pulsar® 3000), EmerALD® reaction chamber, and/or Advance® 400 Series reaction chambers, available from ASM America, Inc. of Phoenix, Ariz. and ASM Europe B.V., Almere, Netherlands. Other commercially available reaction chambers include those from ASM Japan K.K (of Tokyo, Japan) sold under the tradenames Eagle® XP and XP8.

In some embodiments, the second substrate transfer device 128 may be a transfer arm that includes two or more transfer sub-arms. In some embodiments, a main driving portion of each of the two or more transfer sub-arms may have various articulating structures, e.g., a 3-link selective compliant articulated robot arm (SCARA), a 4-link SCARA, a bisymmetric arm, a frog-leg/scissors type arm, and a linear sliding arm. Each of the two or more transfer sub-arms may include one or more end effectors. For example, each of the two or more transfer sub-arms may include a plurality of end effectors, e.g., two end effectors. The number of end effectors may be equal to the number of stations arranged as a matrix in the load-lock chamber 140 or the number of the second reaction chambers 124 in one second process module 122 shown in FIG. 1A.

Each second process module 122 may be connected to the second transfer chamber 125 via the module door 190. The module door 190 may be configured to may be opened and closed to provide access to and to isolate, respectively, the second reaction chamber 124 chamber from the second transfer chamber 125. For example, the second reaction chamber 124 may be isolated from the second transfer chamber 125 after transferring a substrate into the second reaction chamber 124 and while the substrate is processed. Thus, a highly controlled process environment in the second reaction chamber 124 may be maintained and cross contamination may be prevented.

With continued reference to FIG. 1A, the third process module assembly 130 may include a process module 132 and a third transfer chamber 135. One or more module doors 190 may be disposed between the third process module 132 and the third transfer chamber 135. It will be appreciated that the number of the module doors 190 in FIG. 1A is for illustration purposes only and may be varied as desired for substrate access and sealing between volumes. The module doors 190 for the third process module 132 may be opened when the third substrate transfer device 139 transfers a substrate into or from the third process module 132. The module door(s) 190 may be closed after the substrate is transferred into or removed from the third process modules 132. The operation of the module door(s) 190, transfer arms, etc. may be controlled by the controller 180. In some other embodiments, where there is sufficient space in the area of the process module 132 (e.g., where the first and second process module assemblies 110, 120 are spaced apart from the third process module assembly 130, such as by buffer chambers), the process module 132 may be replaced by an additional process module assembly having a central transfer chamber and process modules arrayed around that transfer chamber.

With continued reference to FIG. 1A, the process module 132 may include a plurality of third reaction chambers 134. In some embodiments, each third process module 132 includes four third reaction chambers 134. As illustrated, the four third reaction chambers 134 may be arranged in 2×2 matrix, but other arrangements are possible. The third transfer chamber 135 may include a third substrate transfer device 139, which may be a transfer arm and may also be referred to as a third transfer arm. The third substrate transfer device 139 may be configured to receive a substrate and to transfer the substrate to the third process module 132, the first transfer chamber 115, the second transfer chamber 125, or the load lock chamber 140. It will be appreciated that the third reaction chambers 134 may be similar to the first and second reaction chambers 114, 124. In some embodiments, the third reaction chamber 134 may be a plasma enhanced chemical vapor deposition (CVD) reaction chamber, a thermal CVD reaction chamber, a plasma enhanced atomic layer deposition (ALD) reaction chamber, a thermal ALD reaction chamber, an etching reaction chamber, a UV-curing reaction chamber, etc. The first reaction chamber 114 may include a commercially available reaction chamber such as the F-120® reaction chamber, F-450® reaction chamber, Pulsar® reaction chamber (such as the Pulsar® 2000 and the Pulsar® 3000), EmerALD® reaction chamber, and/or Advance® 400 Series reaction chambers, available from ASM America, Inc. of Phoenix, Ariz. and ASM Europe B.V., Almere, Netherlands. Other commercially available reaction chambers include those from ASM Japan K.K (of Tokyo, Japan) sold under the tradenames Eagle® XP and XP8.

The third substrate transfer device 139 may be a transfer arm that includes two or more transfer sub-arms. In some embodiments, a main driving portion of each of the two or more transfer sub-arms may have various articulating structures, e.g., a 3-link selective compliant articulated robot arm (SCARA), a 4-link SCARA, a bisymmetric arm, a frog-leg/scissors type arm, and a linear sliding arm. Each of the two or more transfer sub-arms may include one or more end effectors. For example, each of the two or more transfer sub-arms may include a plurality of end effectors, e.g., two end effectors. The number of end effectors may be equal to the number of stations arranged as a matrix in the load-lock chamber 140 or the number of the third reaction chambers 134 in the third process module 132 shown in FIG. 1A.

The third process module 132 may connected to the third transfer chamber 135 via a module door 190. The module door 190 may be configured to close to isolate the third reaction chamber 134 chamber from the third transfer chamber 135. For example, the third reaction chamber 134 may be isolated from the third transfer chamber 135 after transferring the substrate into the third reaction chamber 134 and while the substrate is processed. Thus, a highly controlled process environment in the third reaction chamber 134 may be maintained and cross contamination may be prevented.

With continued reference to FIG. 1A, the load lock chamber 140 may include a plurality of load lock stations 142. The transport chamber 150 may include a plurality of load ports 152 for interfacing with external substrate carriers 153 and a plurality of actuators 154, e.g., robot arms, for moving substrates from the substrate carriers 153 to the loadlock stations 142. In some embodiments, the transport chamber 150 may be an equipment front end module (EFEM). In some embodiments, the substrate carriers 153 front opening unified pods (FOUPs). The load lock chamber 140 connects the third transfer chamber 135 and the transport chamber 150 to each other and provide substrate communication between the third transfer chamber 135 and the transport chamber 150.

In some embodiments, load lock chamber 140 may be connected to the transport chamber 150 via a transport door 194 (e.g. a gate valve), and to the third transfer chamber 135 via a load lock door 192 (e.g. a gate valve). In some embodiments, the transport chamber 150 and the third transfer chamber 135 may be connected to opposite sides of the load lock chamber 140. The load lock chamber 140 may be configured to provide a vacuum atmosphere that is approximately equal to the pressure in the third transfer chamber 135 when the third substrate transfer device 139 of the third transfer chamber 135 loads or unloads substrates into or from the load lock chamber 140. Similarly, pressure within the load lock chamber 140 may be changed to match the pressure in the transport chamber 150 when receiving an unprocessed substrate from the transport chamber 150 or returning a processed substrate to the transport chamber 150. A plurality of load lock stations 142 may be provided in the load lock chamber 140. As illustrated, the load lock stations 142 may be arranged in a 2×2 matrix, but other arrangements are possible. The load lock door(s) 192 may be disposed between the third transfer chamber 135 and the load lock chamber 140. It will be appreciated that the number of load lock door(s) 192 in FIG. 1A is for illustrative purposes and may be varied. The load lock door(s) 192 may be opened when the third substrate transfer device 139 transfers a substrate into or out from the load lock chamber 140. The load lock door(s) 192 may be closed after the substrate is transferred into or out from the load lock chamber 140. The operation of the load lock door(s) 192, transfer arms, etc. may be controlled by the controller 180.

The transport chamber 150 may include a door opener (not illustrated) for opening and closing a door of the load ports 152, to provide access for the robot arms 154 that transfer substrates between the load ports 152 and the load lock chamber 140. The robot arms 154 may be moveable in the transport chamber 150, for example, using a guide rail for guiding the movement of the robot arms 154. The load ports 152 contain the substrates in a sealed space (e.g. the interior of an interfacing substrate carrier) so as to protect the substrates against impurities in the atmosphere or chemical pollution. In some embodiments, two robot arms 154 are provided and each robot arm 154 may include two transfer arms. Accordingly, four substrates may be transferred from the load ports 152 into the load lock chamber 140 at the same time. As illustrated, it will be appreciated that, in some embodiments, the number of substrates (e.g., four substrates) that may be simultaneously transferred by the robot arms 154 is equal to the number of load lock stations 142, which in turn may be equal to the number of reaction chambers in each process module of the various process module assemblies.

The transport door 194 is disposed between the transport chamber 150 and the load lock chamber 140. The number of transport door 194 in FIG. 1A is only for illustrative purposes and may be varied. The transport door(s) 194 may be opened when the robot arms 154 transfer a substrate into or out from the load lock chamber 140. The transport door(s) 194 may be closed after the substrate is transferred into or out from the load lock chamber 140. The operation of the load lock door(s) 192, transfer arms, etc. may be controlled by the controller 180.

With reference again to FIG. 1A, the third process module assembly 130 may be disposed between the first process module assembly 110 and the second process module assembly 120. In some embodiments, the first transfer chamber 115 is attached to a first side 116 of the third transfer chamber 135. The second transfer chamber 125 is attached to a second side 126 of the third transfer chamber 135. The first and the second sides 116, 126 may be opposite and substantially parallel to each other. The load lock chamber 140 may be connected to a third side 136 of the third process module assembly 130. The third process module 132 may be attached to a fourth side 138 of the third process module assembly 130. The third side 136 and the fourth side 138 may be opposite and substantially parallel to each other. The first and the second sides 116, 126 and the third and the fourth sides 136, 138 may be perpendicular to each other. When viewed from the load lock chamber 140, the first, third, second process module assemblies 110, 130, 120 may be arranged in a lateral or horizontal direction. For example, the first, third, second process module assemblies 110, 130, 120 may extend laterally relative to the resealable opening provided by the door 192. In some embodiments, the first, third, second process module assemblies 110, 130, 120 may extend along a line substantially parallel to the resealable opening provided by the door 192, as illustrated. In some embodiments, a depth from the load port 152 to the third reaction chamber 132 may be equal to or less than six (6) meters, which may be advantageous for accommodating the processing system 100 in typical clean room environments. Further, although three process module assemblies are illustrated in FIG. 1A for simplicity of illustration and ease of discussion, the processing system 100 may include four or more process module assemblies in some embodiments. Preferably, the four or more process module assemblies are connected laterally, arranged in a line extending laterally relative to the door 192, as discussed herein. When four or more process module assemblies are connected laterally, the length from the load port 152 to the third reaction chamber 132 remains equal to or less than six (6) meters. As a result, flexibility in extending the processing capacity of the processing system 100 may be provided, particularly since many clean room environments may provide greater ability to accommodate equipment in the lateral dimension that in the depth dimension.

One or more chamber doors 191 may be disposed between the first and the third transfer chambers 115, 135, and similar chamber doors 191 may also be disposed between the second and the third transfer chambers 125, 135. The number of the chamber door(s) 191 in FIG. 1A is only for illustrative purposes and may be varied. The chamber door(s) 191 may be opened when a substrate is transferred from one transfer chamber to another transfer chamber. The chamber door(s) 191 may be closed after the substrate is transferred from one transfer chamber to another transfer chamber. The operation of the chamber door(s) 191, transfer arms from moving substrates, etc. may be controlled by the controller 180.

Figure 1B:
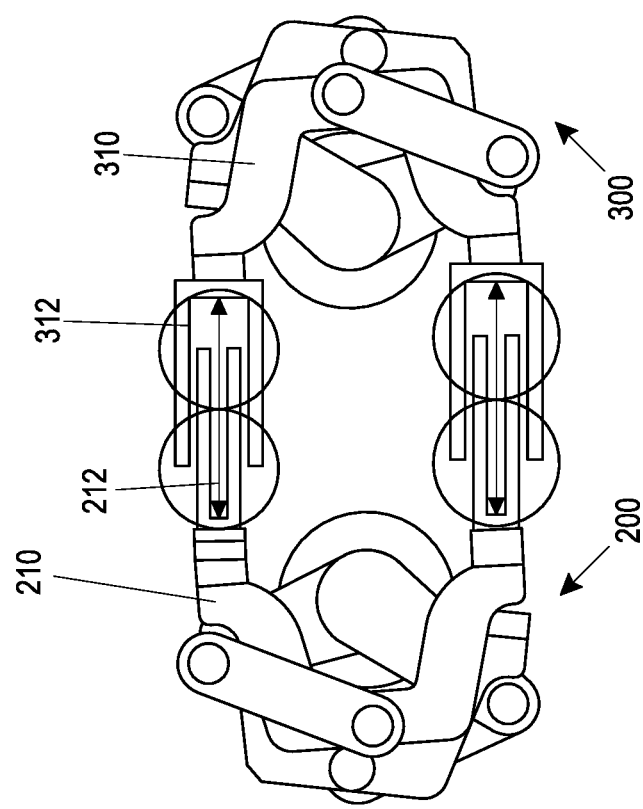
FIG. 1B is a schematic plan view illustrating two substrate transfer devices transferring substrates to one another.

In some embodiments, substrates may be transferred from one transfer chamber to another transfer chamber using a direct handoff of substrates between transfer arms. FIG. 1B is a schematic plan view illustrating two transfer arms transferring substrates directly between one another. A first transfer arm 200 may comprise a plurality of arms 210, each having an end effector 212. A second transfer arm 300 may comprise a plurality of arms 310, each having an end effector 312. The pair of transfer arms 200, 300 may correspond to the pairs of transfer arms 118, 139, and 128, 339 (FIG. 1) in some embodiments. The end effectors 212, 312 each include one or more extensions, which fit together such that each extension can separately support a substrate. In some embodiments, the extensions may be rod-like and a distance between the extensions of each end effector 212, 312 may be selected such that the extensions may be interleaved when brought together, as illustrated. In some embodiments, the spacing between the extensions may be adjusted. In some other embodiments, the spacing between extensions may be fixed.

As illustrated in FIG. 1B, as an example, extensions of the end effectors 212 may be inserted between the extensions of the end effectors 312 and the substrates may be transferred from one end effector to another end effector. For example, to move substrates from the end effectors 312 to the end effectors 212, the end effectors may be positioned such that the extensions of the end effectors 212 are between the extensions of the end effectors 312, and underneath the substrates seated on the end effectors 312. The end effectors 212 may then be moved upward and/or the end effector 312 may be moved downward, so that the substrates come to rest on the end effectors 212, which may then be moved away from the unaffected 312.

Figure 2:
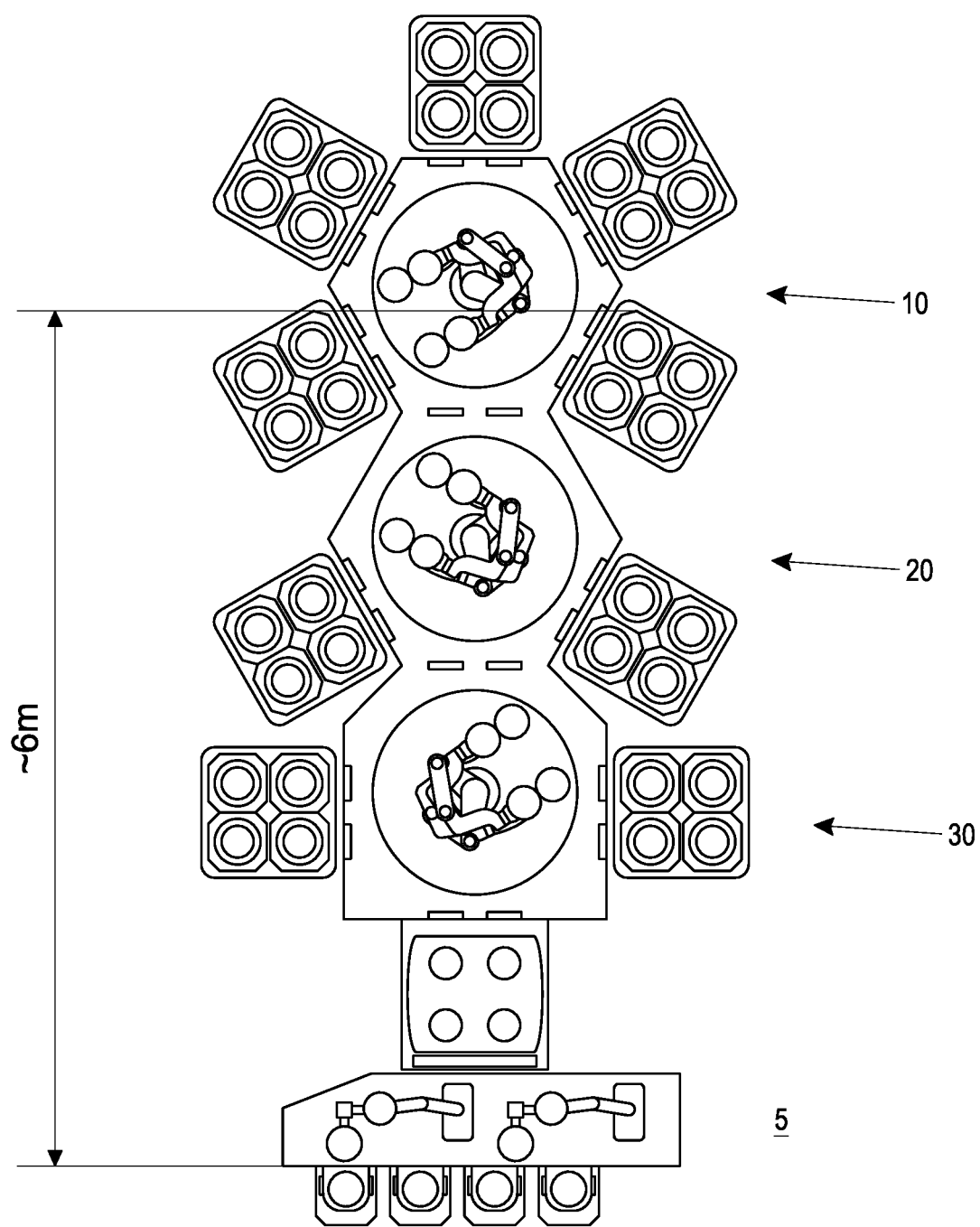
FIG. 2 is a schematic plan view of a substrate processing system equipped with three vertically-oriented process module assemblies.

It will be appreciated that the laterally or horizontally-oriented process module assemblies of FIG. 1 provide various advantages over processing systems with more conventional vertically-oriented process module assemblies. FIG. 2 is a schematic plan view of a substrate processing system 5 equipped with three vertically-oriented process module assemblies 10, 20, 30. Each process module assembly includes a plurality of process modules having multiple reaction chambers as illustrated in FIG. 2. When the substrate processing system 5 is equipped with three vertically-oriented process module assemblies 10, 20, 30, a depth of the fabrication clean room in which the processing system 5 is located may constrain number of process module assemblies that may be accommodated. For example, as illustrated, the vertically-oriented processing system 5 may occupy more than 6 m, which is greater than the depth occupied by the processing system of FIG. 1. Thus, it may not be possible to add further process module assemblies to the vertically-oriented processing system 5. Further, the substrate processing system 5 has nine process modules, while the substrate processing system 100 (FIG. 1A) has 11 process modules. Thus, the number of substrates the substrate processing system 5 is capable of processing is smaller than the substrate processing system 100 in FIG. 1A, even when the two processing systems include equal numbers of process modules assemblies.

Figure 3:
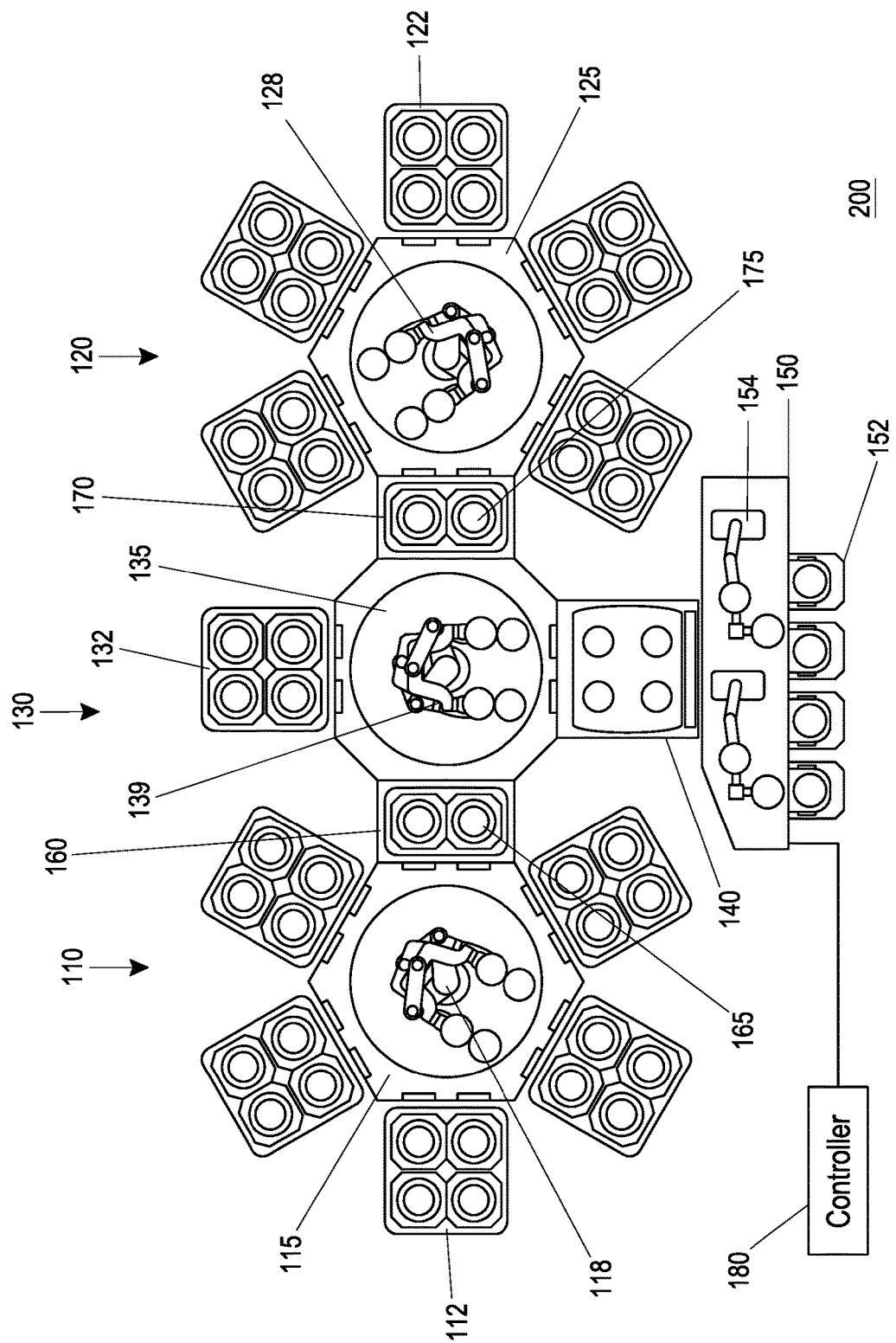
FIG. 3 is a schematic plan view of a substrate processing system equipped with a plurality of horizontally-oriented process module assemblies and intervening buffer chambers.

FIG. 3 is a schematic plan view of a substrate processing system 200 equipped with three process module assemblies 110, 120, 130. The substrate processing system 200 includes a first process module assembly 110, a second process module assembly 120, a third process module assembly 130, a first buffer chamber 160, and a second buffer chamber 170. The substrate processing system 200 may further include a load lock chamber 140 and a transport chamber 150. The substrate processing system 100 is similar to the substrate processing system 100 and has the same functions and configurations as those described for the system 100 illustrated in FIG. 1A except for the first and the second buffer chambers 160, 170.

The first buffer chamber 160 is disposed between the first process module assembly 110 and the third process module assembly 130. The first buffer chamber 160 may isolate the first transfer chamber 115 from the third transfer chamber 135. The first buffer chamber 160 may include a plurality of stations 165 for accommodating substrates to be transferred between the first transfer chamber 115 and the third transfer chamber 135. The number of the stations 165 may vary according to the configuration of the system 100. For example, as illustrated in FIG. 3, the number of the stations 165 may total two (2), although other numbers of stations may be provided. Thus, two substrates may be transferred at overlapping times, e.g., simultaneously. The first buffer chamber 160 may temporarily store substrates when a first substrate transfer device 118 or a third substrate transfer device 139 transports other substrates. For example, when the substrates are transferred from the load lock chamber 140 to one of first process modules 112, the third substrate transfer device 139 transfers the substrates from the load lock chamber 140 and puts the substrates in the stations 165 of the first buffer chamber 160 and then the first substrate transfer device 118 transfers the substrates from the stations 165 to the one of first process modules 112. In some embodiments, the first buffer chamber 260 may be configured to provide a high vacuum function, a degassing function, or a heating function.

The second buffer chamber 170 is disposed between the second process module assembly 120 and the third process module assembly 130. The second buffer chamber 170 may isolate the second transfer chamber 125 and the third transfer chamber 135. The second buffer chamber 170 may include a plurality of stations 175 for accommodating substrates. The number of the stations 175 may vary according to the configuration of the system 100. For example, as illustrated in FIG. 3, the total number of the stations 175 may be two (2), although other numbers of stations may be provided. The second buffer chamber 170 may temporarily store substrates when a second substrate transfer device 128 or a third substrate transfer device 139 transports other substrates. For example, when the substrates are transferred from the load lock chamber 140 to one of the second process modules 122, the third substrate transfer device 139 transfers the substrates from the load lock chamber 140 and puts the substrates in the stations 175 the second buffer chamber 170 and then the second substrate transfer device 128 transfers the substrates from the stations 175 to the one of second process modules 122. In some embodiments, the second buffer chamber 170 may be configured to provide a high vacuum function, a degassing function, or a heating function.

Figure 12:
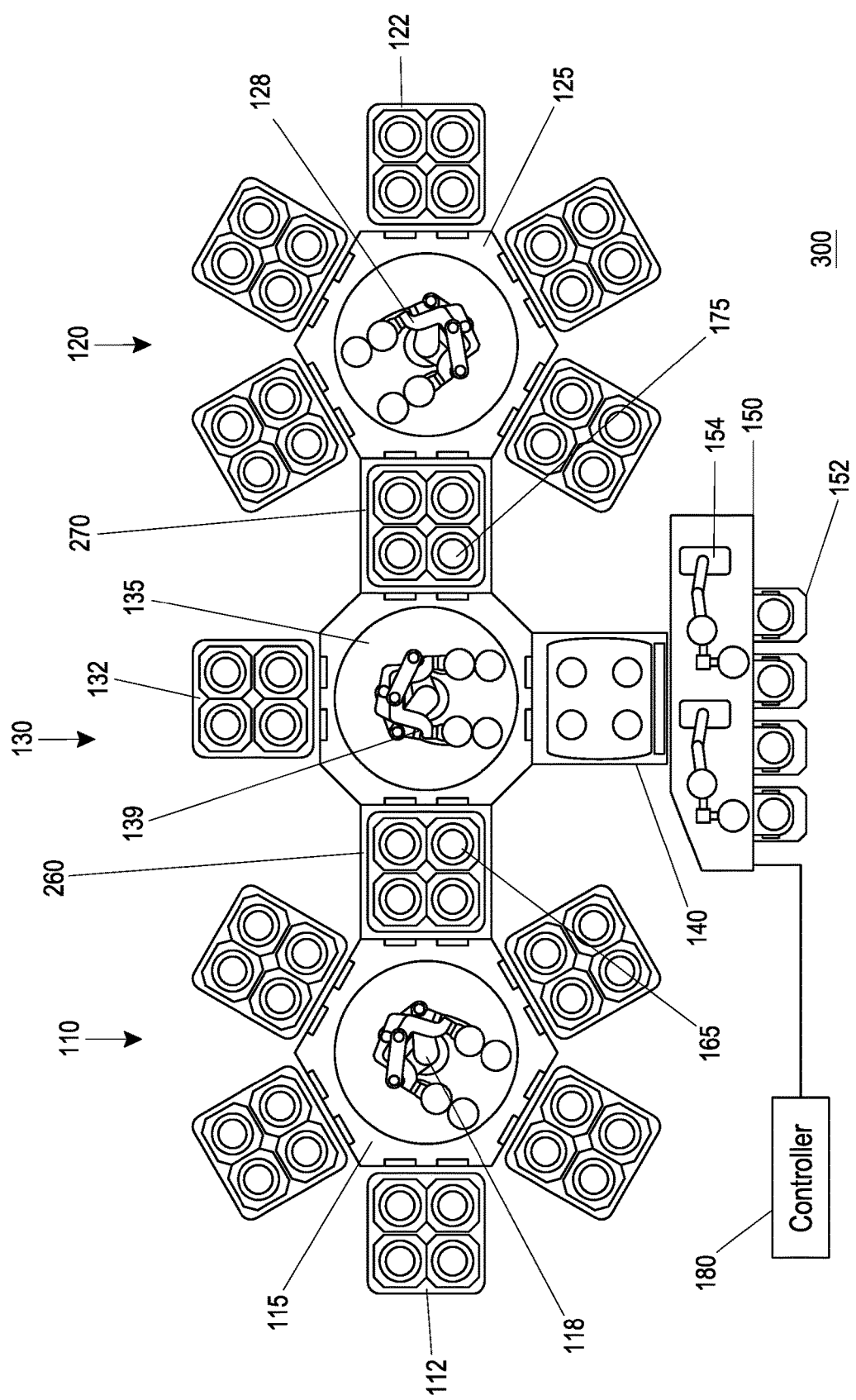
FIG. 12 is a schematic plan view of another substrate processing system equipped with a plurality of process module assemblies and intervening buffer chambers.

As noted above, the buffer chambers 160, 170 may include various numbers of stations 165, 175. FIG. 12 is a schematic plan view of another substrate processing system 300 equipped with three process module assemblies 110, 120, 130. The substrate processing system 300 is similar to the substrate processing system 200 of FIG. 3 and has the same functions and configurations as those described for the system 200 illustrated in FIG. 3, except for the first and the second buffer chambers 260, 270, which replaced the first and second buffer chambers 160, 170, respectively. As illustrated in FIG. 12, the total number of the stations 265, 275 in the first and second buffer chambers 200-6200 70 may each be four (4). Thus, four substrates may be transferred at the same time into and out of the buffer chamber 260, 270.

Figure 4:
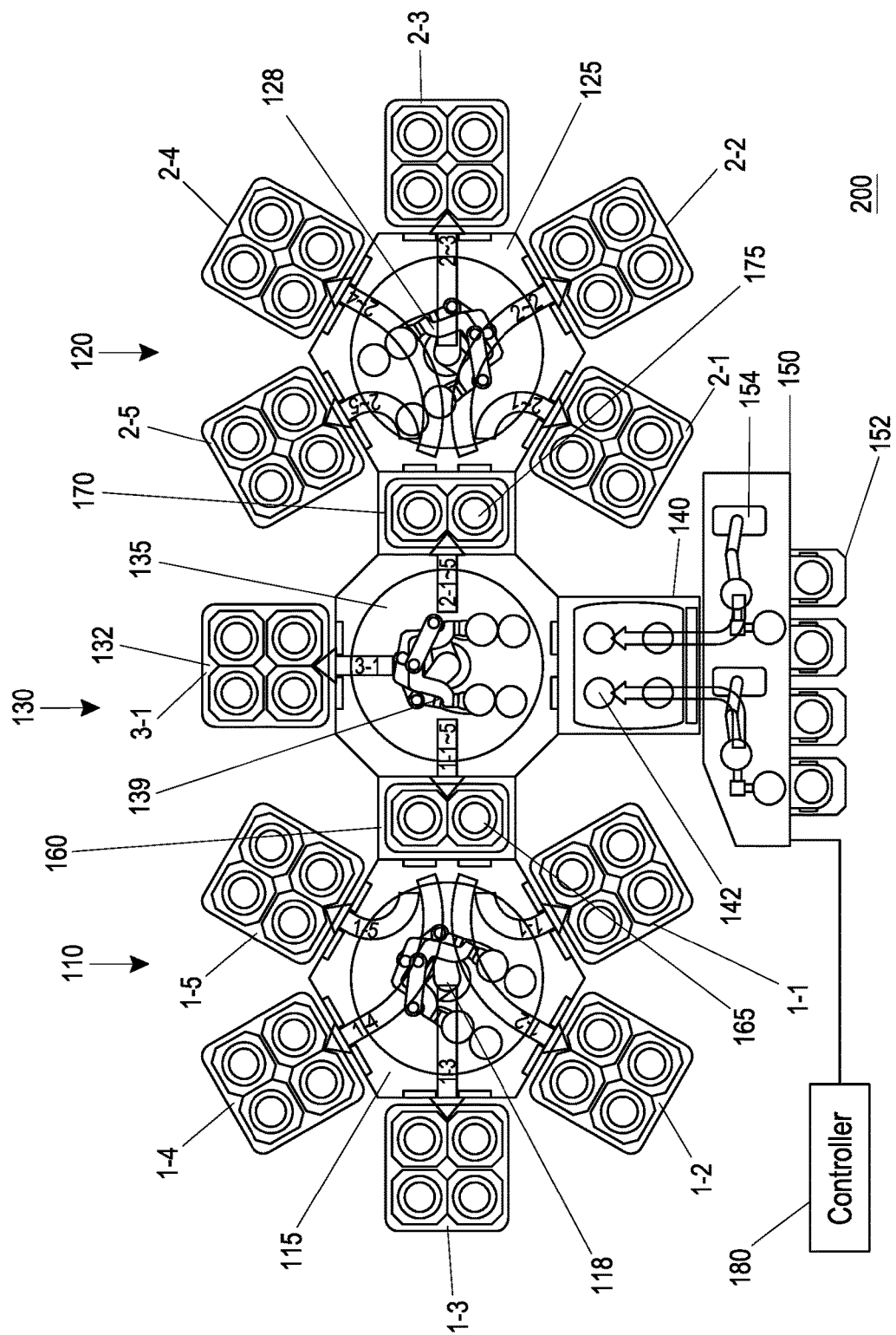
FIG. 4 is schematic plan view of a substrate processing system illustrating a substrate loading sequence.

FIG. 4 is schematic plan view of a substrate processing system 200 of FIG. 3 with arrows showing the movement of substrates to illustrate a substrate loading sequence. FIG. 5 is a table describing the substrate-loading steps in the substrate loading sequence of FIG. 4. As discussed herein, actions for carrying out the loading sequence may be controlled by the controller 180.

In some embodiments, as illustrated in FIGS. 4 and 5, the number of the process modules may be eleven, with each process module having four reaction chambers, and the number of substrates that may be processed may be forty-four, i.e., four substrates for one process module. Other arrangements with different numbers or process modules and/or different numbers of reaction chambers per process module are also possible. For ease of discussion, the process modules in FIG. 4 are identified as 1-1, 1-2, 1-3, 1-4, 1-5, 2-1, 2-2, 2-3, 2-4, 2-5, 3-1, as illustrated. Substrates 1-44 are transferred from the load ports 152 to respective process modules 1-1, 1-2, 1-3, 1-4, 1-5, 2-1, 2-2, 2-3, 2-4, 2-5, 3-1 via the transport chamber 150, the load lock chamber 240, and the first buffer chamber 160 or the second buffer chamber 170. Since the number of stations 165, 175 in respective buffer chamber 160, 170 may be two (2), two substrates may be transferred at a time to the first transfer chamber 115 or the second transfer chamber 125. Regarding FIG. 5, the first row indicates the loading step (e.g., steps 1-25) or time, and the first column indicates the location of substrates at that step or time. The numbers in the format "a, b" in the various entries on the table indicate particular pairs of substrates, such that the table may be understood to diagram the locations of the pairs of substrates within the processing system after performing a particular sequence step. Each step indicates the movement of the substrate from the location indicated on an immediately higher row to the location indicated on the row on which a particular pair of numbers resides. It will be appreciated that the time elapsed during an individual step may vary or be the same as other steps, depending upon the time required to perform a particular substrate transfer from one indicated location to another.

For example, with reference to FIG. 5, substrates 1-20 to be processed in process modules 1-1, 1-2, 1-3, 1-4, 1-5 are sequentially transferred to the respective process module 1-1, 1-2, 1-3, 1-4, 1-5 via the transport chamber 150, the load lock chamber 140, the third transfer chamber 135, the first buffer chamber 160, and the first transfer chamber 115 (FIG. 4). Substrates 21-40 to be processed in process modules 2-1, 2-2, 2-3, 2-4, 2-5 are transferred to the respective process modules 2-1, 2-2, 2-3, 2-4, 2-5 via the transfer chamber 150, the load lock chamber 140, the third transfer chamber 135, the second buffer chamber 170, and the second transfer chamber 125 (FIG. 4). Substrates 41-44 to be processed in process modules 3-1 are transferred via the transport chamber 150, the load lock chamber 140, and the third transfer chamber 135.

As can be seen in FIG. 5, a total of 25 steps may be performed until all forty-four substrates are transferred into their respective process module. In some embodiments, in step 24 the substrates 37-38 and the substrates 41-42 may be transferred to the process module 2-5 and the process module 3-1, respectively, at the same time since the substrates 41-42 may be transferred from the third transfer chamber 135 to the process module 3-1 unimpeded by the movement of other substrates. In step 25 the substrates 39-40 and the substrates 43-44 may be transferred to the process module 2-5 and the process module 3-1, respectively, at the same time since the substrates 43-44 may be transferred from the third transfer chamber 135 to the process module 3-1 unimpeded by the movement of other. Further, transfer of the substrates 41-44 may be facilitated since the third substrate transfer device 139 has four arms.

As can be seen in FIG. 4, substrates are transferred to the first or the second transfer chamber 115, 125 through a third transfer chamber 135, which is deposed between the first and the second transfer chambers 115, 125. Thus, the substrates do not need to cross the first, second and third transfer chambers 115, 125, 135 multiple times, unlike the conventional vertically-oriented process module assemblies illustrated in FIG. 2, in which substrates for the farthest process module assembly may need to traverse two different transfer chambers in order to get to that process module assembly. This may provide advantages over processing systems with more conventional vertically-oriented process module assemblies. For example, the number of transfer steps may be reduced.

Figure 6:
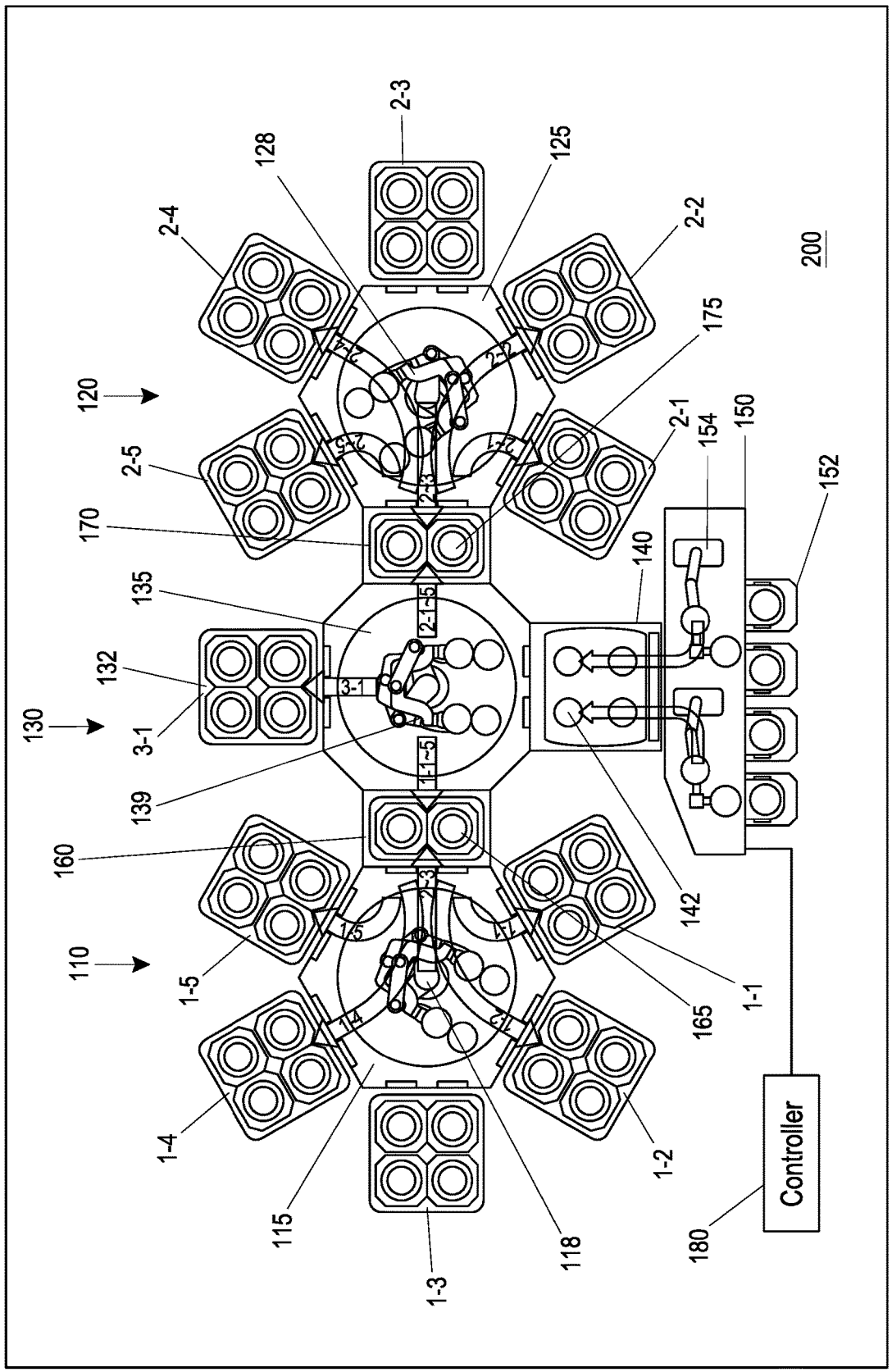
FIG. 6 is schematic plan view of a substrate processing system illustrating a substrate unloading sequence.
Figure 7:
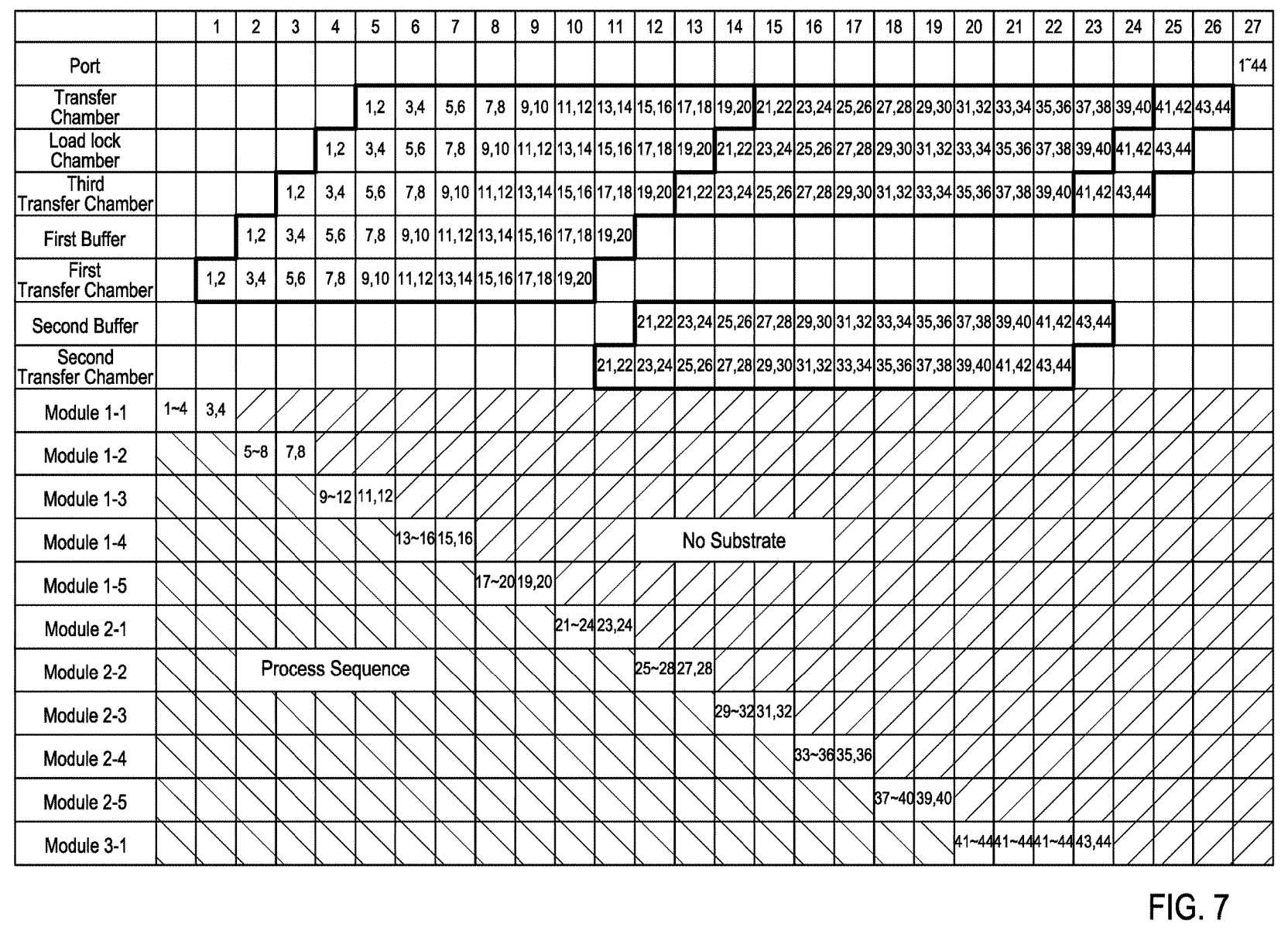

FIG. 6 is schematic plan view of a substrate processing system 200 illustrating a substrate unloading sequence. FIG. 7 is a table describing the substrate-unloading steps in the substrate loading sequence of FIG. 6. In some embodiments, as illustrated in FIGS. 6 and 7, after a process is completed in respective process module 1-1, 1-2, 1-3, 1-4, 1-5, 2-1, 2-2, 2-3, 2-4, 2-5, 3-1, the substrates 1-44 are sequentially transferred from the respective process module 1-1, 1-2, 1-3, 1-4, 1-5, 2-1, 2-2, 2-3, 2-4, 2-5, 3-1 to the load ports 152 via the transfer chamber 150, the load lock chamber 240 and the first buffer chamber 160 or the second buffer chamber 170.

For example, the substrates 1-20 in process modules 1-1, 1-2, 1-3, 1-4, 1-5 are transferred to the load ports 152 via the first transfer chamber 115, the first buffer chamber 160, the third transfer chamber 135, the load lock chamber 140 and the transfer chamber 150. The substrates 21-40 in process modules 2-1, 2-2, 2-3, 2-4, 2-5 are transferred to the load ports 152 via the second transfer chamber 125, the second buffer chamber 170, the third transfer chamber 135, the load lock chamber 140 and the transport chamber 150. The substrates 41-44 in process modules 3-1 are transferred to the load ports 152 via the third transfer chamber 135, the load lock chamber 140, and the transport chamber 150. The substrates 41-44 wait in the process module 3-1' until the third chamber 135 is available after the process is completed. As can be seen in FIG. 7, total 27 steps may be performed until all forty-four substrates are transferred into the load ports 152.

Figure 8:
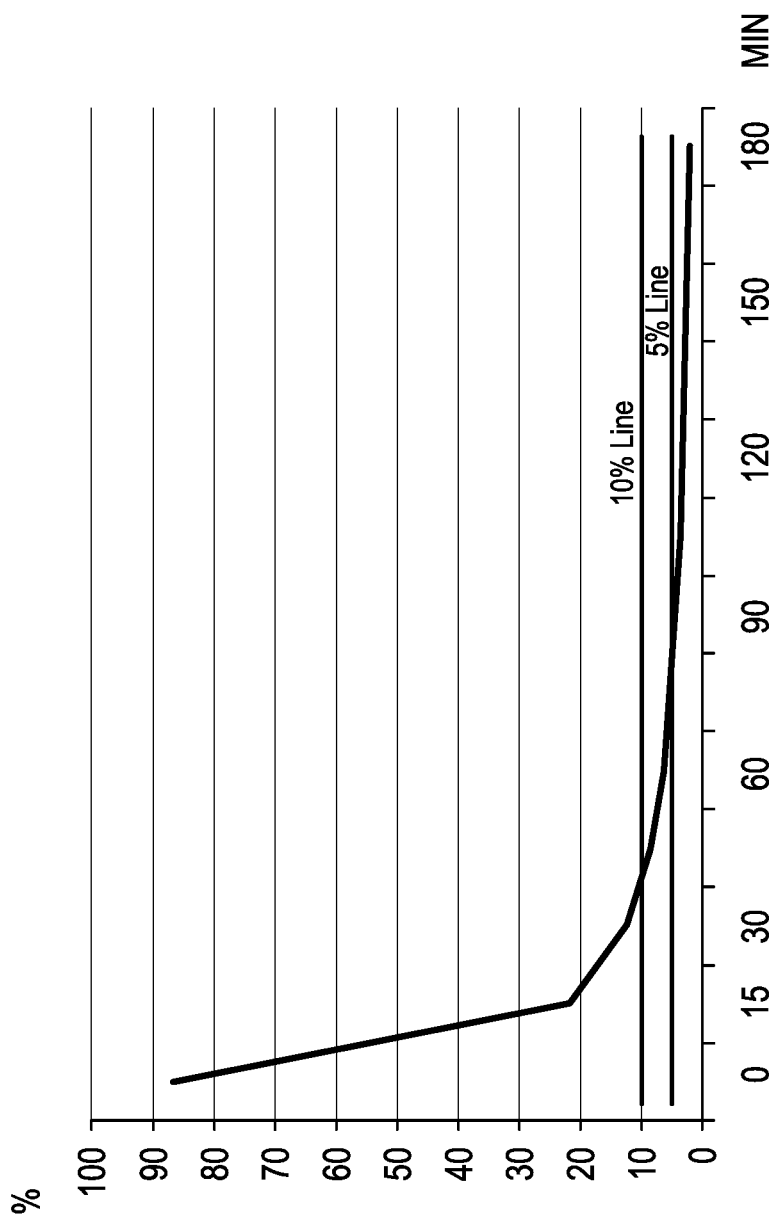
FIG. 8 is a graph illustrating a relationship between a substrate process time and a rate at which process modules stand empty.
Figure 9B:
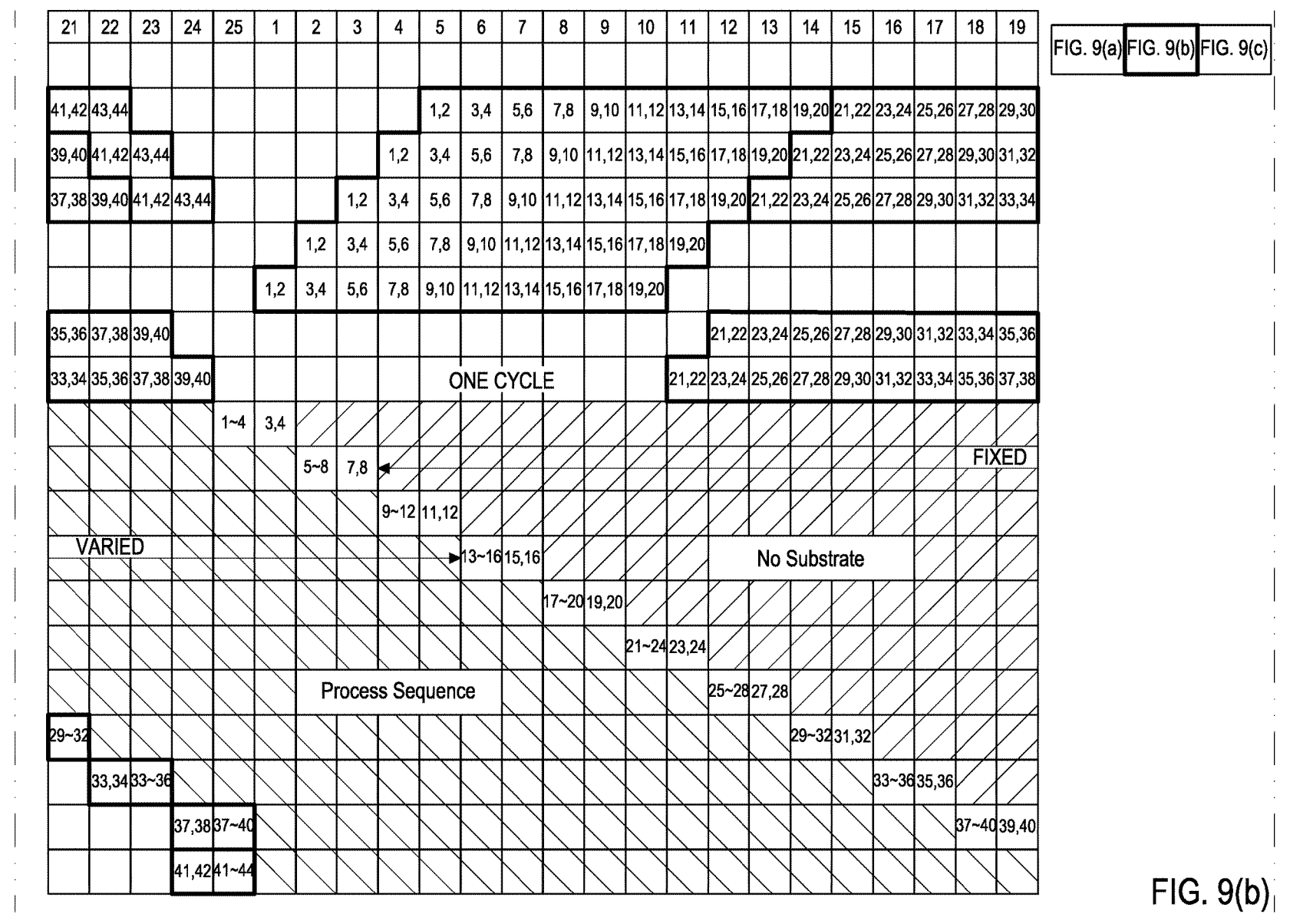
Figure 9C:
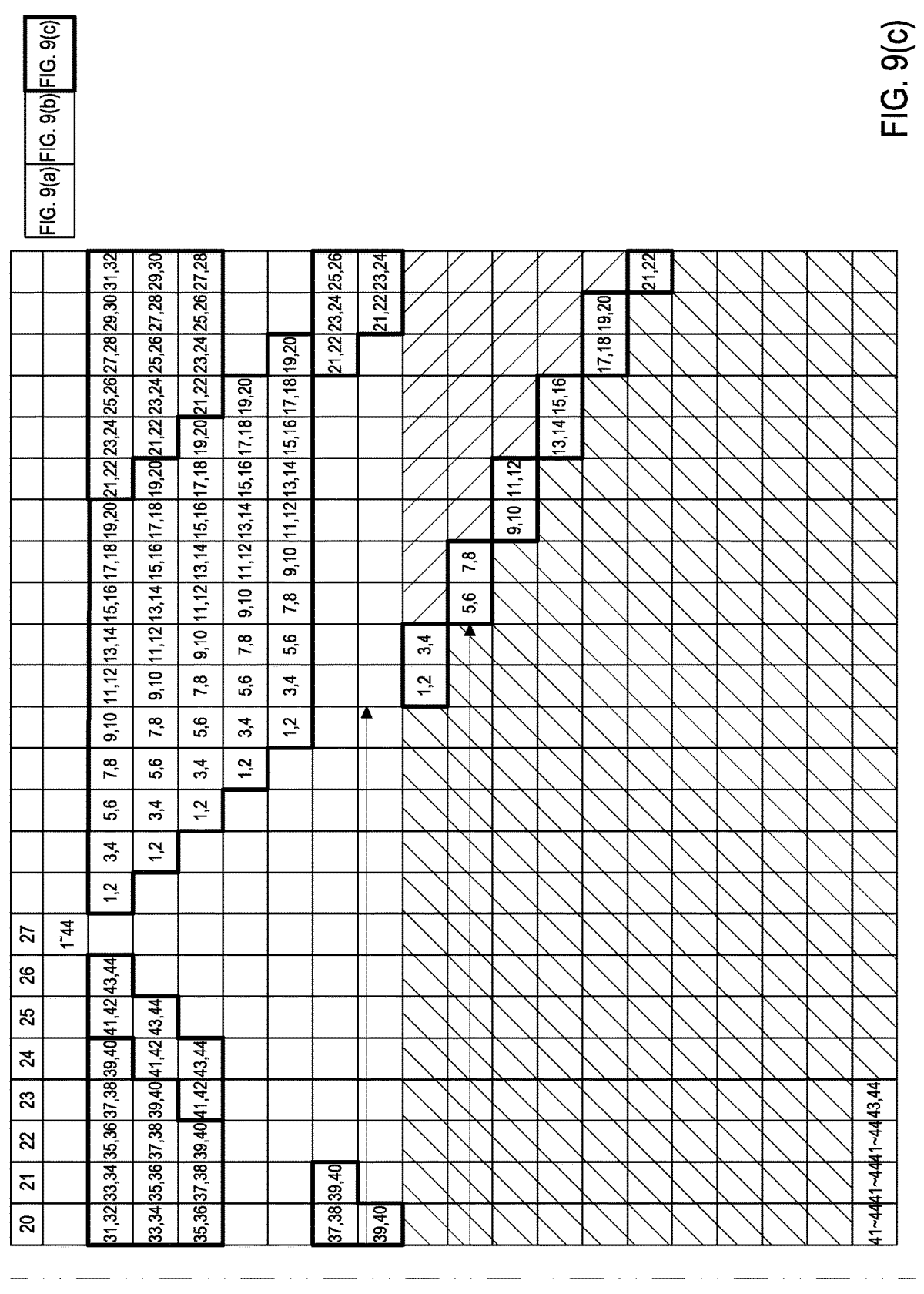

FIG. 8 is a graph illustrating the relationship between substrate process time and a rate at which process modules stand empty. FIGS. 9(a)-9(c) form a diagram schematically illustrating an overall sequence using the substrate processing system 200 of FIGS. 4 and 6. The X-axis of FIG. 8 represents processing cycle time in the process module. The processing cycle time may vary according to the type of process being performed. The Y-axis of FIG. 8 represents the percentage of the total process cycle time during which a process module is empty and waiting for a substrate to process. Referring to FIGS. 9(a)-9(c), the total process cycle time may be defined as a duration in which substrates are loaded into a process module, the substrates are processed in the process module, the process module is unloaded, and up until the time that new substrates are loaded into the process module. The duration for carrying out a process on a substrate in a process module may vary according to the process to be performed. However, the duration in which the substrates are transferred out of the process module and new substrates are transferred into the process module is fixed because of the configuration of the substrate processing system, and the steps needed to accomplish the movement of substrates within that system. Thus, as the process time becomes longer, the percentage of the process cycle time in which a process module is empty and waiting for the next substrate to process becomes smaller as illustrated in FIG. 8. For example, when the processing time is approximately thirty-eight (38) minutes, the percentage of the process cycle time in which a process module which to receive a new substrate to process may be less than ten (10) percent. When the processing time is approximately eighty-two (82) minutes, the percentage of the process cycle time in which a process module which to receive a new substrate to process may be less than five (5) percent.

FIG. 10 is another example of a table showing substrate-loading steps for the substrate processing system of FIG. 4. With reference to FIG. 4, the first substrate transfer device 118 and the second substrate transfer device 128 may transfer substrates approximately at the same time (or at overlapping times). For example, process modules of the first and second process module assemblies 110, 120 may be loaded simultaneously. In some embodiments, the transfer arm 154 picks four substrates from the load ports 152 and transfers them into the load lock chamber 142. The third substrate transfer device 139 picks up four substrates from the load lock chamber 140 and transfers two substrates each to the first buffer chamber 160 and the second buffer chamber 170. The first substrate transfer device 118 and the second substrate transfer device 128 pick the two substrates from the first buffer chamber 160 and the second buffer chamber 170, respectively. The first substrate transfer device 118 and the second substrate transfer device 128 transfer the two substrates to a respective process module of the first and second process module assemblies 110, 120, respectively. Thus, substrates may be transferred into the process modules 1-1, 1-2, 1-3, 1-4, 1-5, 2-1, 2-2, 2-3, 2-4, 2-5 approximately at the same (or overlapping) time as illustrated in FIG. 10. In steps 11-14, four substrates 41-44 may be transferred together to the process module 3-1 because the four substrates 41-44 may be transferred to process module 3-1 directly using the substrate transfer device 139. Since the process module 3-1 may potentially be filled with four substrates faster than the process modules 1-5, 2-5, a process for the process module 3-1 may start earlier than that for the process modules 1-5, 2-5. In this embodiment, a total of 15 steps may be performed until all forty-four substrates are transferred into the respective process module.

FIG. 11 is a table describing the substrate-unloading steps for the substrate processing system of FIG. 6. As explained with FIG. 10, the first substrate transfer device 118 and the second substrate transfer device 128 may transfer substrates at approximately the same (or overlapping) time. If all processes for each process module take approximately the same time, a process for module 3-1 may be completed earlier than a process for the modules 1-5, 2-5 because the process for the process module 3-1 may start earlier than that for the process modules 1-5, 2-5 as explained with reference to FIG. 10. In some embodiments, in steps 8-12, the third transfer chamber 135 may be used for transferring substrates from the process modules 1-4, 2-4 (and 1-5, 2-5), the substrates in the process module 3-1 may stay in the process module 3-1 even after the process in the process module 3-1 is completed until the transfer of substrates in the process modules 1-4, 3-4 (and 1-5, 2-5) is completed. Thus, a process having longer process time may be performed in the process module 3-1. In this embodiment, a total of 16 steps may be performed until all forty-four substrates are transferred into the respective process module.

Although in the foregoing description the invention is illustrated with reference to some embodiments, it is not so limited. Indeed, various modifications of the invention in addition to those shown and described herein will become apparent to those skilled in the art from the foregoing description and fall within the scope of the appended claims. In all of the disclosed embodiments, any element used in some embodiments may interchangeably or additionally be used in another embodiment unless such a replacement is not feasible or causes adverse effect or does not work for its intended purposes. All publications, patents and patent applications cited herein are hereby incorporated by reference in their entirety for all purposes to the same extent as if each individual publication, patent or patent application were specifically and individually indicated to be so incorporated by reference. Further details of the invention are provided in the following non-limiting examples.

Throughout this application, the use of singular includes the plural unless expressly stated otherwise. In this application, the use of "or" includes "and/or", unless expressly stated otherwise. Furthermore, the terms, "include," "including," and "included," are not limiting.

What is claimed is:

1. A semiconductor processing system for processing substrates, the processing system comprising:
   a first process module assembly comprising:
      a first transfer chamber comprising a first substrate transfer device; and
      a plurality of first process modules, the first process modules each attached to the first transfer chamber and accessible by the first substrate transfer device;
   a second process module assembly comprising:
      a second transfer chamber comprising a second substrate transfer device; and
      a plurality of second process modules, the second process modules each attached to the second transfer chamber and accessible by the second substrate transfer device;
   a third process module assembly between the first process module assembly and the second process module assembly, the third process module assembly comprising:
      a third transfer chamber comprising a third substrate transfer device;
      a third process module attached to the third transfer chamber and accessible by the third substrate transfer device; and
      a resealable opening for receiving substrates from an external environment,
      wherein a first side of the third process module assembly is attached to the first process module assembly and a second side of the third process module assembly is attached to the second process module assembly; and
   a controller configured to perform actions comprising:
      sequentially loading substrates from a load lock chamber to the first process modules, the second process modules and the third process module using the first, the second, and the third substrate transfer devices;
      processing substrates loaded into the process modules; and
      unloading, using the first, the second, and the third substrate transfer devices, processed substrates from the first and second process modules before unloading processed substrates from the third process module.

2. The processing system of claim 1, wherein processing substrates comprises sequentially starting processing of substrates in the process modules upon completion of loading of each process module, while other process modules are being loaded.

3. The processing system of claim 1, wherein unloading processed substrates comprises sequentially unloading substrates from the first process modules, the second process modules, and then the third process module.

4. The processing system of claim 1, wherein the first process module assembly and the second process module assembly are attached to opposite sides of the third process module assembly.

5. The processing system of claim 1, further comprising: the load lock chamber configured to interface with the resealable opening; and a transport chamber comprising a plurality of load ports for interfacing with substrate carriers, wherein the transport chamber is attached to and configured to provide substrates to the load lock chamber.

6. The processing system of claim 1, wherein the third process module is attached to a side of the third transfer chamber opposite the resealable opening.

7. The processing system of claim 1, wherein each of the first process modules, the second process modules, and the third process module comprises four reaction chambers for processing substrates.

8. The processing system of claim 1, wherein sequentially loading substrates comprises:
   directly transferring substrates from the third substrate transfer device to the first substrate transfer device; and
   directly transferring substrates from the third substrate transfer device to the second substrate transfer device.

9. The processing system of claim 1, wherein the first substrate transfer device comprises first arms, each having a first end effector,
   the second substrate transfer device comprises second arms, each having a second end effector, and
   the third substrate transfer device comprises third arms, each having a third end effector,
   wherein each of the first, second and the third end effectors comprising two pick-up extensions that are spaced apart from each other, wherein a distance between the two pick-up extensions of the third end effector is different from that between the two pick-up extensions of the first and the second end effectors.

10. The processing system of claim 1, wherein each of the first transfer chamber and the second transfer chamber has a shape of a hexagon as viewed from above and comprises five sides for interfacing with five first process modules and five second process modules, respectively.

11. The processing system of claim 1, wherein the load lock chamber comprises a plurality of load lock stations for accommodating a plurality of substrates.

12. The processing system of claim 1, further comprising a first buffer chamber disposed between the first process module assembly and the third process module assembly and a second buffer chamber disposed between the second process module assembly and the third process module assembly.

13. The processing system of claim 12, wherein the first buffer chamber and the second buffer chamber comprise two stations each configured to accommodate a substrate, respectively.

14. The processing system of claim 12, wherein the first buffer chamber and the second buffer chamber comprise four stations each configured to accommodate a substrate, respectively.

15. A semiconductor processing system for processing substrates, the processing system comprising:
   a first process module assembly comprising:
      a first transfer chamber comprising a first substrate transfer device; and
      a plurality of first process modules, the first process modules each attached to the first transfer chamber and accessible by the first substrate transfer device;
   a second process module assembly comprising:
      a second transfer chamber comprising a second substrate transfer device; and
      a plurality of second process modules, the second process modules each attached to the second transfer chamber and accessible by the second substrate transfer device;
   a third process module assembly between the first process module assembly and the second process module assembly, the third process module assembly comprising:
      a third transfer chamber comprising a third substrate transfer device;

a third process module attached to the third transfer chamber and accessible by the third substrate transfer device; and a resealable opening for receiving substrates from an external environment, wherein a first side of the third process module assembly is attached to the first process module assembly and a second side of the third process module assembly is attached to the second process module assembly; and a controller configured to perform actions comprising:

loading substrates into the first process modules and the second process modules at overlapping times;

subsequently loading substrates into the third process module;

processing substrates loaded into the process modules;

unloading processed substrates from the first process modules and the second process modules at overlapping times; and subsequently unloading processed substrates from the third process module.

16. The processing system of claim 15, further comprising:

a load lock chamber configured to interface with the resealable opening; and a transport chamber comprising a plurality of load ports for interfacing with substrate carriers, wherein the transport chamber is attached to and configured to provide substrates to the load lock chamber.

17. The processing system of claim 15, wherein each of the first process module, the second process module, and the third process module comprises four reaction chambers for processing substrates.

18. The processing system of claim 15, wherein each of the first transfer chamber assembly and the second transfer chamber has a shape of a hexagon as viewed from above and comprises five sites for interfacing with five first process modules and five second process modules, respectively.

19. The processing system of claim 15, wherein each of the first substrate transfer device, the second substrate transfer device, and the third substrate transfer device comprises four arms, respectively.

20. The processing system of claim 15, further comprising a first buffer chamber disposed between the first process module assembly and the third process module assembly and a second buffer chamber disposed between the second process module assembly and the third process module assembly.

21. The processing system of claim 20, wherein the first buffer chamber and the second buffer chamber comprise two stations each configured to accommodate a substrate.

22. The processing system of claim 20, wherein the first buffer chamber and the second buffer chamber comprise four stations each configured to accommodate a substrate.

* * * * *